(12) United States Patent
Koyama (10) Patent No.: US 9,780,249 B2
(45) Date of Patent: Oct. 3, 2017

(54) SEMICONDUCTOR LIGHT-RECEIVING DEVICE

(75) Inventor: Yuji Koyama, Kanagawa (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 520 days.

(21) Appl. No.: 13/456,310

(22) Filed: Apr. 26, 2012

(65) Prior Publication Data

US 2012/0273909 A1 Nov. 1, 2012

(30) Foreign Application Priority Data

Apr. 28, 2011 (JP) .................................. 2011-102260

(51) Int. Cl.
  *H01L 31/0232* (2014.01)
  *H01L 31/16* (2006.01)
  *H01L 31/105* (2006.01)

(52) U.S. Cl.
  CPC ........ *H01L 31/16* (2013.01); *H01L 31/02325* (2013.01); *H01L 31/105* (2013.01)

(58) Field of Classification Search
  CPC .... H01L 31/0232; H01L 31/105; H01L 31/16
  USPC .................. 257/432, 458, E31.103, E31.127
  See application file for complete search history.

(56) References Cited

U.S. PATENT DOCUMENTS

| 2007/0063292 A1* | 3/2007 | Ueda ............................ 257/393 |
| 2008/0001245 A1 | 1/2008 | Yoneda et al. |
| 2010/0289103 A1* | 11/2010 | Yamamoto .................... 257/458 |

FOREIGN PATENT DOCUMENTS

| JP | 04-290477 A | 10/1992 |
| JP | 05-082829 A | 4/1993 |
| JP | 2008-010776 A | 1/2008 |
| JP | 2010-267647 A | 11/2010 |

OTHER PUBLICATIONS

American Heritage Dictionary defnition of "overlay."*
Office Action dated Jan. 27, 2015, issued in corresponding Japanese Patent Application No. 2011-102260, with English translation (8 pages).

* cited by examiner

*Primary Examiner* — Hrayr A Sayadian
(74) *Attorney, Agent, or Firm* — Westerman, Hattori, Daniels & Adrian, LLP (57) ABSTRACT

A semiconductor light-receiving includes: a substrate; a semiconductor light-receiving element that is provided on the substrate and has a first conductivity region and a second conductivity region; a first electrode electrically coupled to the first conductivity region; a second electrode electrically coupled to the second conductivity region; an insulating layer located on the second conductivity region; and a wiring that is located on the insulating layer and is electrically coupled to the first electrode, the wiring being elongated from the first electrode to a peripheral region of the semiconductor light-receiving element, the wiring having a region of first width and a region of second width narrower than the first width, the region of second width of the wiring being located on the second conductivity region.

7 Claims, 10 Drawing Sheets

FIRST EMBODIMENT

FIG. 1A

FIRST COMPARATIVE EXAMPLE

FIG. 1B  SECOND COMPARATIVE EXAMPLE

FIG. 2

FIRST EMBODIMENT

FIRST EMBODIMENT

FIRST EMBODIMENT

FIG. 7B

SECOND EMBODIMENT

FIG. 8

SECOND EMBODIMENT

SEMICONDUCTOR LIGHT-RECEIVING DEVICE

CROSS-REFERENCE TO RELATED APPLICATION

This application is based upon and claims the benefit of priority of the prior Japanese Patent Application No. 2011-102260, filed on Apr. 28, 2011, the entire contents of which are incorporated herein by reference.

BACKGROUND (i) Technical Field

The present invention relates to a semiconductor light-receiving device.

(ii) Related Art

Japanese Patent Application Publication No. H04-290477 discloses a semiconductor light-receiving device having a flip-chip type mesa semiconductor light-receiving element on a semiconductor substrate. An upper electrode is provided on an upper face of the mesa semiconductor light-receiving element.

SUMMARY

When a wiring is formed from the upper electrode to an electrode pad on a substrate in the semiconductor light-receiving element, the wiring passes through surface of the light-receiving element. In this case, a capacitance is generated on the light-receiving element. If the capacitance is reduced, an inductance is enlarged.

It is an object to provide a semiconductor light-receiving device restraining both the capacitance and the inductance.

According to an aspect of the present invention, there is provided a semiconductor light-receiving device including: a substrate; a semiconductor light-receiving element that is provided on the substrate and has a first conductivity region and a second conductivity region; a first electrode electrically coupled to the first conductivity region; a second electrode electrically coupled to the second conductivity region; an insulating layer located on the second conductivity region; and a wiring that is located on the insulating layer and is electrically coupled to the first electrode, the wiring being elongated from the first electrode to a peripheral region of the semiconductor light-receiving element, the wiring having a region of first width and a region of second width narrower than the first width, the region of second width of the wiring being located on the second conductivity region.

According to another aspect of the present invention, there is provided another semiconductor light-receiving device including: a plurality of light-receiving elements provided on a substrate; each of the light-receiving element having a first conductivity region and a second conductivity region, a first electrode electrically being coupled to the first conductivity region and a second electrode electrically coupled to the second conductivity region; an insulating layer located on the second conductivity region of the light-receiving elements; and a wiring located on the insulating layer, for electrically coupling between the first electrode of one of the light-receiving elements and the second electrode of another of the light-receiving elements, the wiring having a region of first width and a region of second width narrower than the first width, the region of second width of the wiring being located on the second conductivity region.

DETAILED DESCRIPTION

Figure 1A:
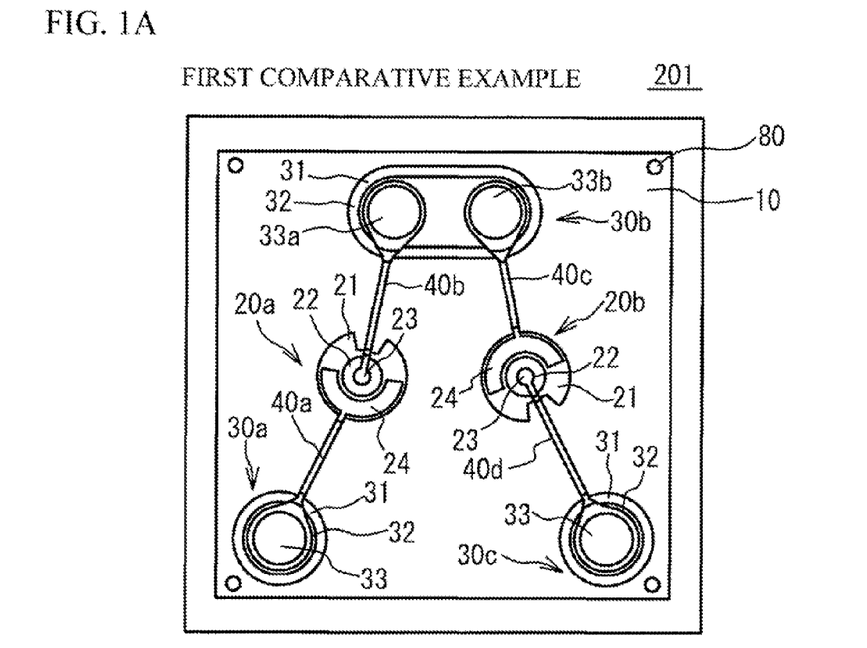
FIG. 1A illustrates a top view of a semiconductor light-receiving device in accordance with a first comparative example.
Figure 1B:
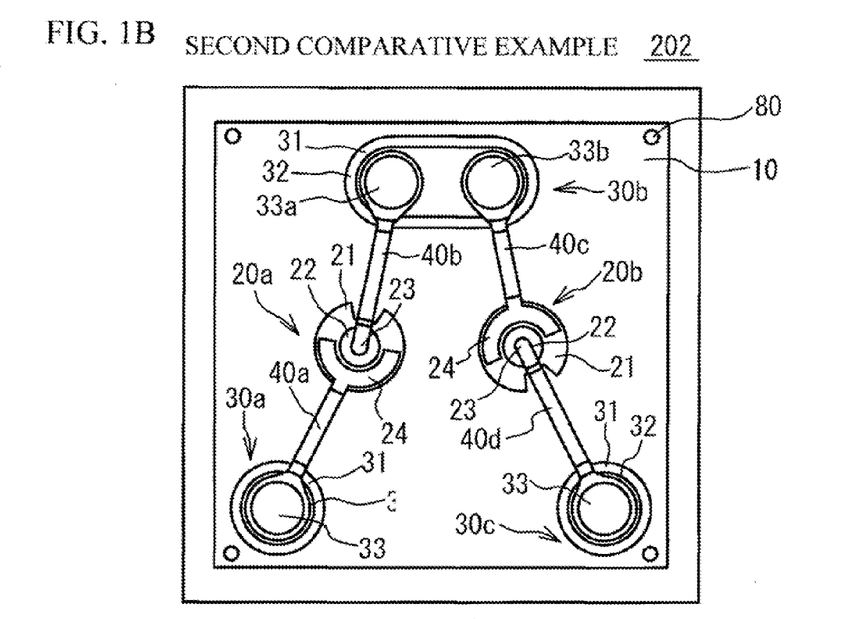
FIG. 1B illustrates a top view of a semiconductor light-receiving device in accordance with a second comparative example.

FIG. 1A illustrates top view of a semiconductor light-receiving device 201 in accordance with a first comparative example. FIG. 1B illustrates a top view of a semiconductor light-receiving device 202 in accordance with a second comparative example. As illustrated in FIG. 1A and FIG. 1B, the semiconductor light-receiving devices 201 and 202 have a structure in which light-receiving elements 20a and 20b and dummy mesas 30a through 30c are provided on a semiconductor substrate 10. The light-receiving elements 20a and 20b and the dummy mesas 30a through 30c have a mesa shape. The semiconductor light-receiving devices 201 and 202 have chip area and a scribed area around the chip area. An alignment mark 80 is formed on a corner of the chip area.

The light-receiving elements 20a and 20b have a structure in which an upper mesa 22 and an upper electrode 23 are provided on a lower mesa 21 in this order. For example, the lower mesa 21 has a circular cylinder shape. The upper mesa 22 has a circular cylinder shape having a diameter smaller than the lower mesa 21, and is arranged on a center of the lower mesa 21. The upper mesa 22 acts as a light-receiving area. The upper electrode 23 has a circular cylinder shape having a diameter smaller than the upper mesa 22, and is arranged on a center of the upper mesa 22. That is, the light-receiving elements 20a and 20b has a mesa shape whose diameter is larger at lower portion and is smaller at upper portion. Further, the light-receiving elements 20a and 20b have a lower electrode 24 on the lower mesa 21 except for the upper mesa 22. In the first and second comparative examples, the upper electrode 23 acts as a p-side electrode, and the lower electrode 24 acts as an n-side electrode.

The dummy mesas 30a and 30c have a structure in which an upper mesa 32 and an upper electrode 33 are provided on a lower mesa 31 in this order. For example, the lower mesa 31 has a circular cylinder shape. The upper mesa 32 has a circular cylinder shape having a diameter smaller than the lower mesa 31, and is arranged on a center of the lower mesa 31. The upper electrode 33 has a circular cylinder shape having a diameter smaller than the upper mesa 32 and is arranged on a center of the upper mesa 32. That is, the dummy mesas 30a and 30c have a mesa shape whose diameter is larger at lower portion and is smaller at upper portion.

In the dummy mesa 30b, the upper mesa 32 is provided on the lower mesa 31. And, an upper electrode 33a and an upper electrode 33b are provided on the upper mesa 32. The upper electrode 33a is coupled to a wiring 40b. The upper electrode 33b is coupled to a wiring 40c. The upper electrode 33a and the upper electrode 33b are provided on an insulating layer, and are spaced from each other. Thus, the upper electrode 33a is electrically insulated from the upper electrode 33b. The dummy mesas 30a through 30c do not have a function as a light-receiving element.

The upper electrode 33 of the dummy mesa 30a is coupled to the lower electrode 24 of the light-receiving element 20a by a wiring 40a going through a surface of the dummy mesa 30a, an upper face of the semiconductor substrate 10, and a surface of the light-receiving element 20a. The upper electrode 23 of the light-receiving element 20a is coupled to the upper electrode 33a of the dummy mesa 30b by the wiring 40b going through the surface of the light-receiving element 20a, the upper face of the semiconductor substrate 10, and a surface of the dummy mesa 30b.

The upper electrode 33b of the dummy mesa 30b is coupled to the lower electrode 24 of the light-receiving element 20b by a wiring 40c going through the surface of the dummy mesa 30b, the upper face of the semiconductor substrate 10, and a surface of the light-receiving element 20b. The upper electrode 23 of the light-receiving element 20b is coupled to the upper electrode 33 of the dummy mesa 30c by a wiring 40d going through the surface of the light-receiving element 20b, the upper face of the semiconductor substrate 10, and a surface of the dummy mesa 30c.

The surface of the light-receiving elements 20a and 20b, the surface of the dummy mesas 30a through 30c, and the upper face of the semiconductor substrate 10 are covered by an insulating layer such as silicon nitride (SiN). The wirings 40a through 40d are provided on the insulating layer. Thus, each wiring is insulated from the light-receiving elements 20a and 20b, the dummy mesas 30a through 30c and the semiconductor substrate 10.

In the semiconductor light-receiving devices 201 and 202, the wirings 40b and 40d coupled to the p-side electrode face with the n-type semiconductor through the insulating layer when going through the surface of the light-receiving elements 20a and 20b. Thus, a capacitance and an inductance are generated between the wirings 40b and 40d and the n-type semiconductor. There are methods of increasing the thickness of the insulating layer and using an insulating layer having a large relative permittivity in order to reduce the capacitance. However, with the methods, it is necessary to change a processing condition, and characteristics may be degraded.

And so, the width of the wirings 40b and 40d may be reduced as the first comparative example. When the width of the wirings 40b and 40d is reduced, the capacitance of the side face of the light-receiving elements 20a and 20b is reduced. However, the inductance of the semiconductor light-receiving device is enlarged as a whole. On the other hand, when the width of the wirings 40b and 40d are enlarged, the capacitance of the side face of the light-receiving elements 20a and 20b is enlarged. Therefore, the capacitance and the inductance have a trade-off relation in the semiconductor light-receiving device. A description will be given of semiconductor light-receiving devices restraining both the capacitance and the inductance, in the following embodiments.

First Embodiment

Figure 2:
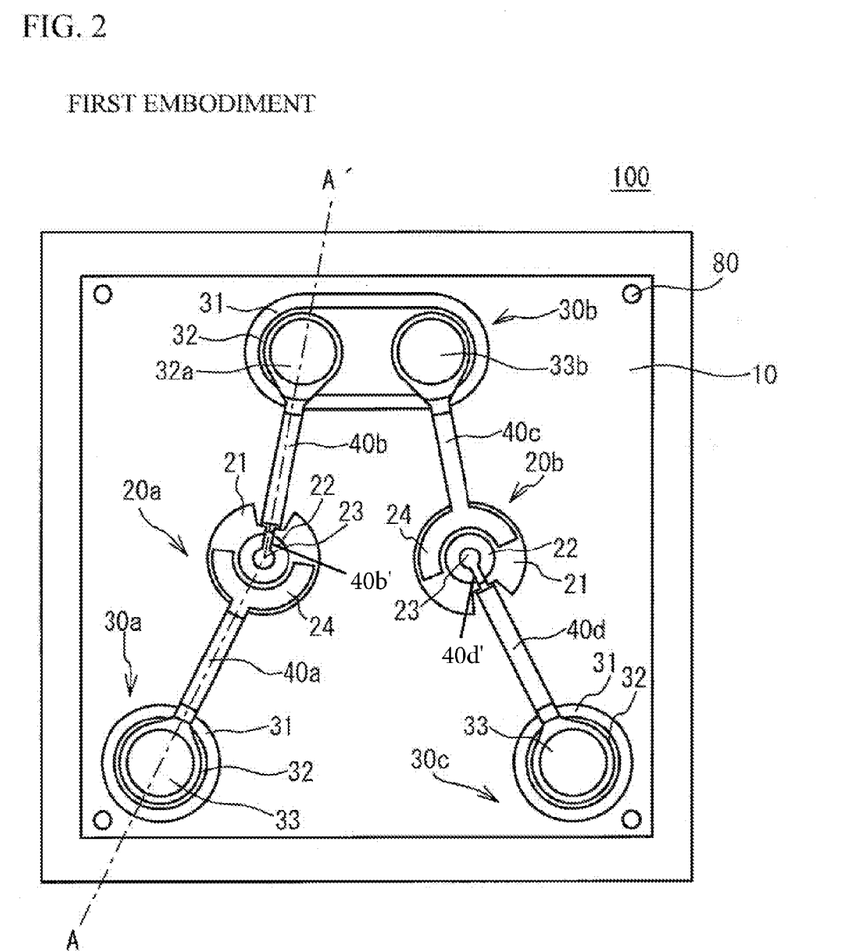
FIG. 2 illustrates a top view of a semiconductor light-receiving device in accordance with a first embodiment.
Figure 3A:
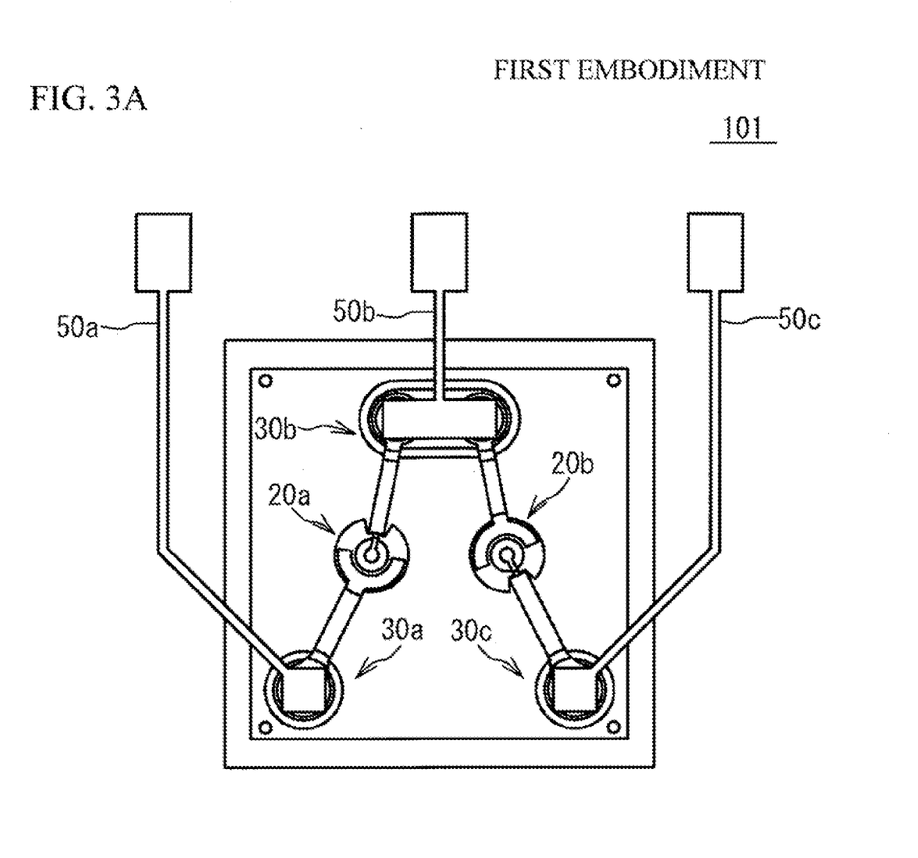
FIG. 3A illustrates a carrier and a semiconductor light-receiving device.
Figure 3B:
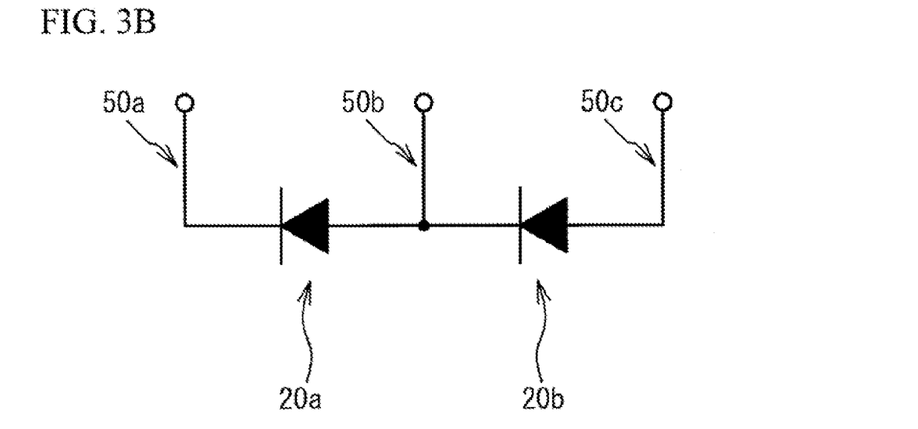
FIG. 3B illustrates a circuit diagram of a semiconductor light-receiving device.

FIG. 2 illustrates a top view of a semiconductor light-receiving device 100 in accordance with a first embodiment. FIG. 3A illustrates a semiconductor light-receiving device 101 in which the semiconductor light-receiving device 100 is coupled to a carrier 50. FIG. 3B illustrates a circuit diagram of the semiconductor light-receiving device 101. As illustrated in FIG. 3A and FIG. 3B, the shape of the wirings 40b and 40d of the semiconductor light-receiving device 100 is different from that of the semiconductor light-receiving devices 201 and 202. In the first embodiment, the wiring 40b has a narrow width (second width) on the surface of the light-receiving element 20a, and has a wide width (first width) on the semiconductor substrate 10. The wiring 40d has a narrow width (second width) on the surface of the light-receiving element 20b and has a wide width (first width) on the semiconductor substrate 10. Thus, both the capacitance and the inductance are restrained.

As illustrated in FIG. 3A, a carrier wiring 50a is coupled to the upper electrode 33 of the dummy mesa 30a. A carrier wiring 50b is coupled to the upper electrode 33 of the dummy mesa 30b. A carrier wiring 50c is coupled to the upper electrode 33 of the dummy mesa 30c.

As illustrated in FIG. 3B, in the semiconductor light-receiving device 101, the light-receiving elements 20a and 20b act as a balanced type light-receiving element in which the light-receiving elements 20a and 20b are coupled in series in an identical direction. A p-side electrode of the light-receiving element 20a is coupled to an n-type electrode of the light-receiving element 20b. The carrier wiring 50a acts as an n-type terminal coupled to the n-side electrode of the light-receiving element 20a. The carrier wiring 50b acts as a common terminal coupled between the light-receiving element 20a and the light-receiving element 20b. The carrier wiring 50c acts as a p-side terminal coupled to the p-side electrode of the light-receiving element 20b. An output signal is extracted from the common terminal. In the example of FIG. 3B, a reverse bias is applied to the p-type terminal and the n-type terminal. Thus, the balanced type semiconductor light-receiving device 101 enlarges signal amplitude and outputs the signal. A description will be given of the detail.

Figure 4:
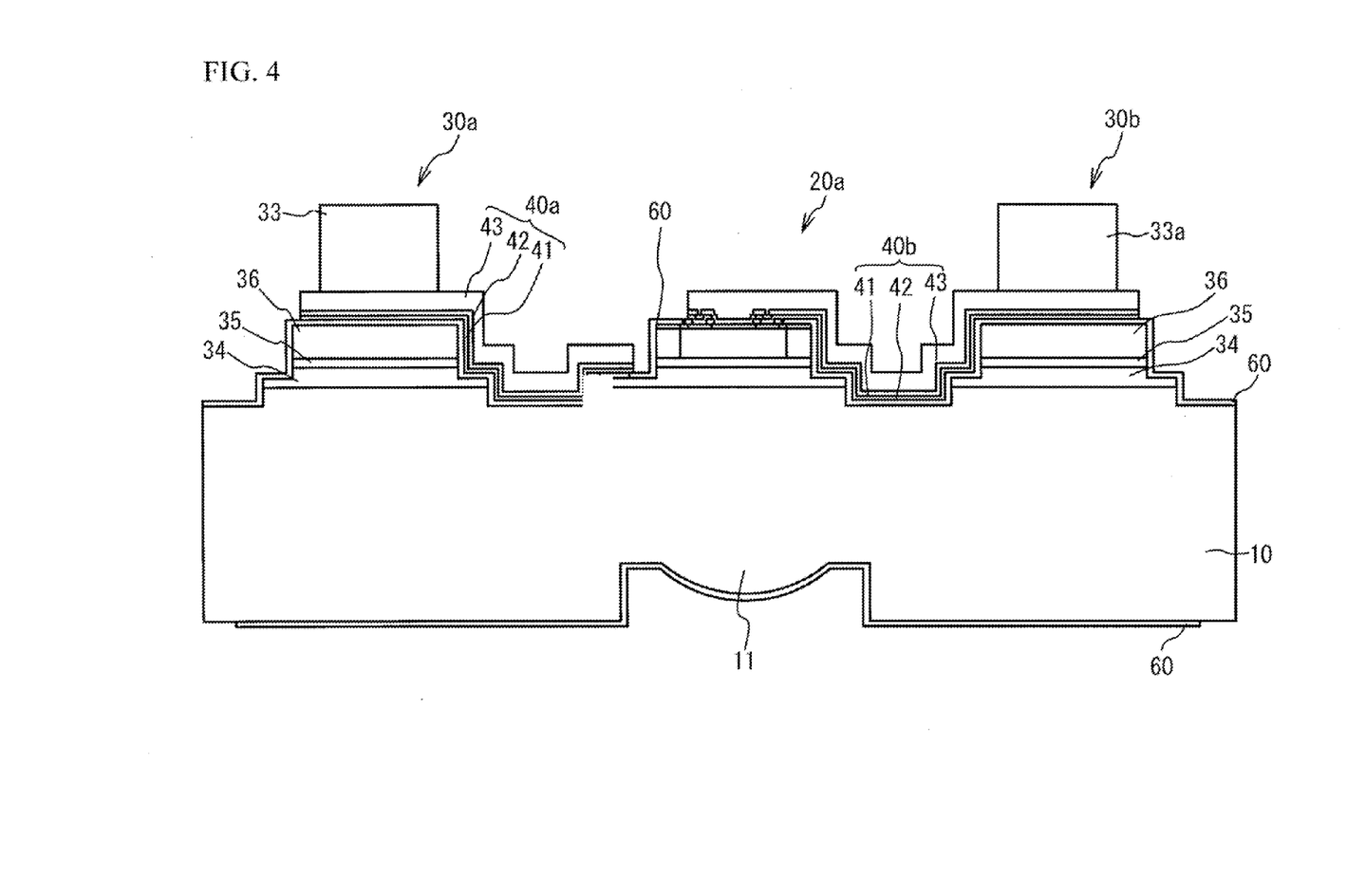
FIG. 4 illustrates a cross sectional view taken along a line A-A of FIG. 2.
Figure 5:
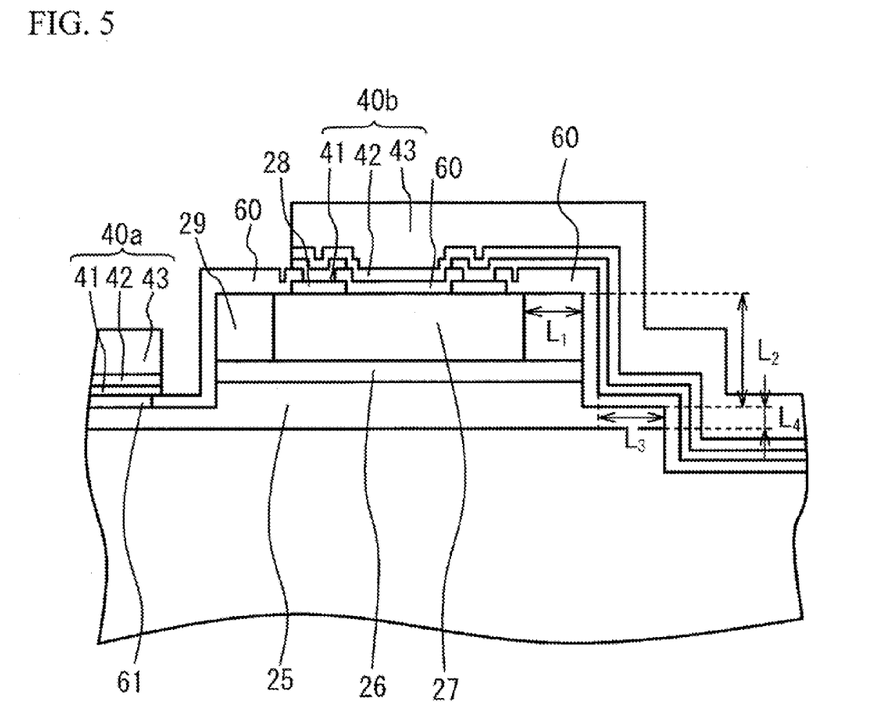
FIG. 5 illustrates an enlarged view of a light-receiving element.

FIG. 4 illustrates a cross sectional view taken along a line A-A' of FIG. 2. FIG. 5 illustrates an enlarged cross sectional view of the light-receiving element 20a. As illustrated in FIG. 4 and FIG. 5, the light-receiving element 20a has a structure in which an n-type semiconductor layer 25, an i-type semiconductor layer 26, a p-type semiconductor layer 27 and a contact layer 28 are provided on the semiconductor substrate 10 in this order. The n-type semiconductor layer 25 is, for example, made of n-type InP. The i-type semiconductor layer 26 is, for example, made of i-type InGaAs. The p-type semiconductor layer 27 is, for example, made of p-type InP. The thickness of the n-type semiconductor layer 25 is, for example, 1.0 μm. The thickness of the i-type semiconductor layer 26 is, for example, 1.0 μm. The thickness of the p-type semiconductor layer 27 is, for example, 1.0 μm.

The p-type semiconductor layer 27 has a diameter smaller than the i-type semiconductor layer 26. An n-type semiconductor layer 29 is provided on the side face of the p-type semiconductor layer 27 on the i-type semiconductor layer 26. The n-type semiconductor layer 29 is, for example, made of n-type InP. The semiconductor substrate 10 is made of a semi-insulated semiconductor and has resistivity of $2.2 \times 10^7$ Ωcm to $6.6 \times 10^7$ Ωcm. The contact layer 28 is, for example, made of p-type InGaAs. The lower mesa 21 of FIG. 2 includes the n-type semiconductor layer 25. The upper mesa 22 of FIG. 2 includes a part of the n-type semiconductor layer 25, the i-type semiconductor layer 26, the p-type semiconductor layer 27, the contact layer 28 and the n-type semiconductor layer 29. The light-receiving element 20b has the same structure as the light-receiving element 20a. A lens 11 is formed on the reverse face of the semiconductor substrate 10 facing with the light-receiving elements 20a and 20b. Thus, an incoming light to the reverse face of the semiconductor substrate 10 is focused into the light-receiving elements 20a and 20b. And a wall of the semiconductor substrate 10 surrounds an edge of the lens 11.

The dummy mesas 30a and 30b have a structure in which an n-type semiconductor layer 34, an i-type semiconductor layer 35 and an n-type semiconductor layer 36 are provided on the semiconductor substrate 10 in this order. The n-type semiconductor layer 34 is, for example, made of n-type InP. The i-type semiconductor layer 35 is, for example, made of i-type InGaAs. The n-type semiconductor layer 36 is, for example, made of n-type InP. The lower mesa 31 of FIG. 2 includes the n-type semiconductor layer 34. The upper mesa 32 of FIG. 2 includes a part of the n-type semiconductor layer 34, the i-type semiconductor layer 35 and the n-type semiconductor layer 36. The dummy mesa 30c has the same structure as the dummy mesa 30a.

An insulating layer 60 covers the surface of the light-receiving elements 20a and 20b, the surface of the dummy mesas 30a through 30c, the surface of the semiconductor substrate 10. The wirings 40a and 40b have a structure in which a Ti/Pt layer 41, an Au sputtering layer 42, and an Au coating layer 43 are laminated in this order from the semiconductor substrate 10 side, and is provided on the insulating layer 60. Thus, the wirings 40a and 40b are insulated from the light-receiving element 20a, the dummy mesas 30a and 30b and the semiconductor substrate 10. The thickness of the insulating layer 60 is, for example, 0.2 μm. The thickness of the wirings 40a and 40b is, for example, 2.0 μm.

The insulating layer 60 has an opening on the contact layer 28. Thus, the contact layer 28 of the light-receiving element 20a is contact to the wiring 40b. Similarly, the contact layer 28 of the light-receiving element 20b is contact to the wiring 40d. The insulating layer 60 has an opening on the lower mesa 21 except for the upper mesa 22. A contact layer 61 is formed in the opening of the lower mesa 21. Thus, the n-type semiconductor layer 25 of the light-receiving element 20a is contact to the wiring 40a through the contact layer 61. Similarly, the n-type semiconductor layer 25 of the light-receiving element 20b is contact to the wiring 40c through the contact layer 61. The contact layer 61 is, for example, made of AuGe/Au. The insulating layer 60 covers the surface of the dummy mesas 30a through 30c and covers the semiconductor substrate 10 between the light-receiving elements and the dummy mesas.

The wiring 40a on the lower mesa 21 of the light-receiving element 20a acts as the lower electrode 24 of the light-receiving element 20a. The wiring 40b on the contact layer 28 of the light-receiving element 20a acts as the upper electrode 23 of the light-receiving element 20a. The wiring 40c on the lower mesa 21 of the light-receiving element 20b acts as the lower electrode 24 of the light-receiving element 20b. The wiring 40d on the contact layer 28 of the light-receiving element 20b acts as the upper electrode 23 of the light-receiving element 20b.

Next, a description will be given of the capacitance of the light-receiving elements 20a and 20b. In the example of FIG. 5, the capacitance is generated in an area where the wirings 40b and 40d coupled to the p-type semiconductor layer 27 faces with the n-type semiconductor layer or the i-type semiconductor layer through the insulating layer 60. In concrete, the area includes an area where the wirings 40b and 40d face with the upper face of the n-type semiconductor layer 29 in the upper mesa, an area where the wirings 40b and 40d face with the side face of the n-type semiconductor layer 29, the i-type semiconductor layer 26 and the n-type semiconductor layer 25 in the upper mesa, an area where the wirings 40b and 40d face with the upper face of the n-type semiconductor layer 25 in the lower mesa, and an area where the wirings 40b and 40d face with the side face of the n-type semiconductor layer 25 in the lower mesa. In the example of FIG. 5, the p-type semiconductor layer 27 acts as a first conductivity type region. The n-type semiconductor layer 29 and the n-type semiconductor layer 25 acts as a second conductivity type region. The upper electrode 23 acts as a first electrode. The lower electrode 24 acts as a second electrode.

As illustrated in FIG. 5, the thickness and the length of the insulating layer 60 on the n-type semiconductor layer 29 are $(d_1 + d_2)$ and $L_1$ respectively. The thickness and the length of the insulating layer 60 from the side face of the n-type semiconductor layer 29 to the bottom side of the upper mesa are $d_2$ and $L_2$ respectively. The thickness and the length of the insulating layer 60 on the lower mesa are $d_2$ and $L_3$ respectively. The thickness and the length of the insulating layer 60 on the side face of the n-type semiconductor layer 25 of the lower mesa are $d_2$ and $L_4$ respectively. In this case, the capacitance C is expressed as the following equation (1). In the equation (1), "w" indicates a width of a wiring. "$\epsilon_r$" indicates a relative permittivity. "$\epsilon_0$" indicates a permittivity in vacuum.

[Equation 1]

$$C = \varepsilon_0 \cdot \varepsilon_r \cdot w \cdot \left( \frac{L_1}{d_1 + d_2} + \frac{L_2 + L_3 + L_4}{d_2} \right) \quad (1)$$

In accordance with the equation (1), the capacitance C is proportional to the width "w" of the wiring. Therefore, the capacitance C is restrained when the width "w" of the wirings 40b and 40d is narrowed in at least a part of an area where the wirings 40b and 40d face with the n-type semiconductor layer. On the other hand, a parasitic capacitance is generated between the semiconductor substrate 10 and the wiring 40b. However, the influence on the capacitance between the wiring 40b and the semiconductor substrate 10 is less than on the n-type semiconductor layer. Even if the width of the wiring on the semiconductor substrate 10 is enlarged, the capacitance does not get larger than a case where the width of the wiring on the n-type semiconductor layer is enlarged. Therefore, when the width of the wiring on the semiconductor substrate 10 is enlarged, the whole inductance of the semiconductor light-receiving device 100 is restrained. In this way, both the capacitance and the inductance are restrained because the width of the wiring is reduced in an area having a large influence on the capacitance, and the width of the wiring is enlarged in an area having a small influence on the capacitance. The wide width (first width) of the wirings 40*b* and 40*d* of FIG. 2 is, for example, 20.0 μm. The narrow width (second width) in wirings 40*b*' and 40*d*' is, for example, 5.0 μm. The width of the wirings 40*a* and 40*c* is, for example, 20.0 μm.

Second Embodiment

Figure 6:
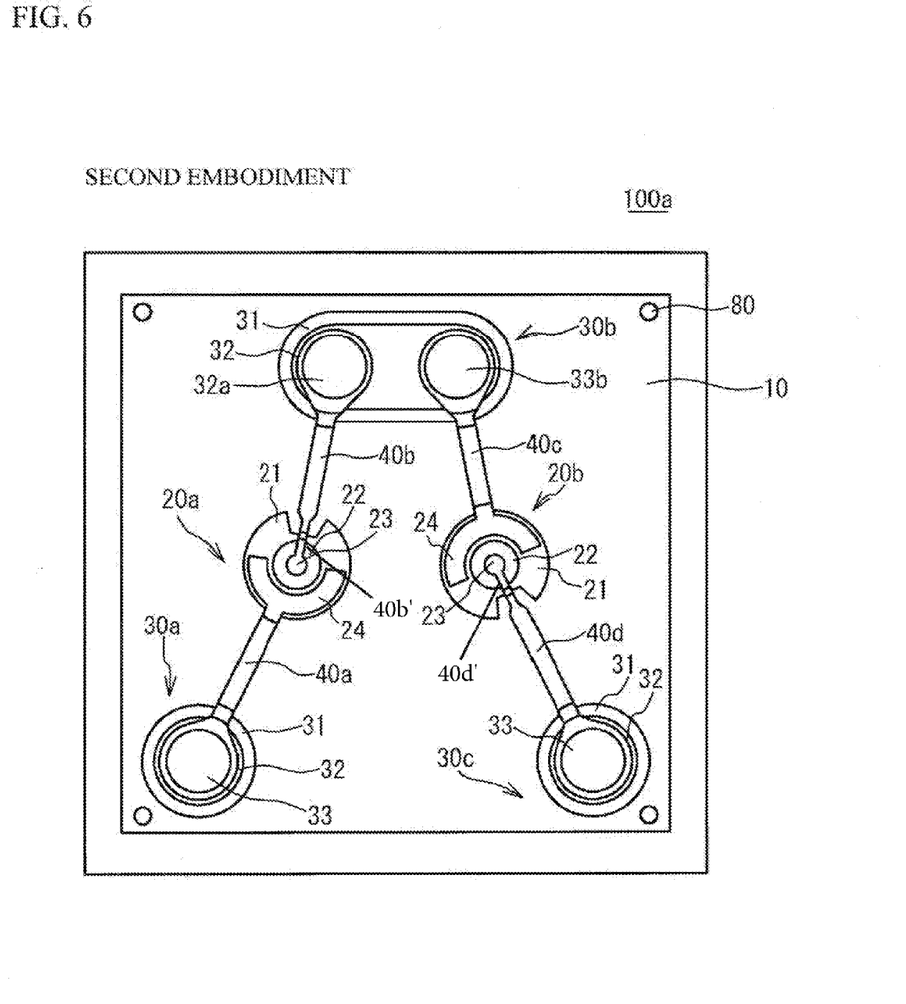
FIG. 6 illustrates a top view of a semiconductor light-receiving device in accordance with a second embodiment.
Figure 7A:
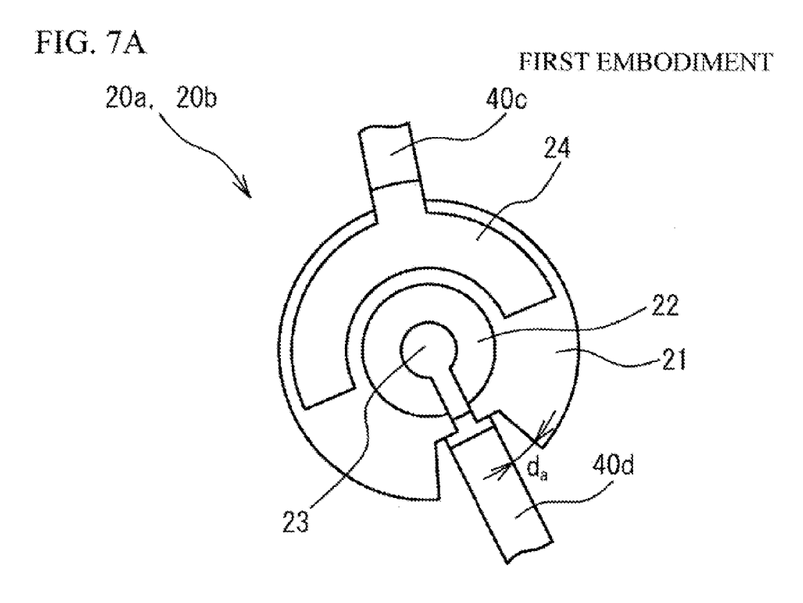
FIG. 7A illustrates an enlarged top view of a light-receiving element in accordance with the first embodiment.

FIG. 6 illustrates a top view of a semiconductor light-receiving device 100*a* in accordance with a second embodiment. The shape of the wirings 40*b* and 40*d* of the semiconductor light-receiving device 100*a* is different from that of the semiconductor light-receiving device 100 of FIG. 2. FIG. 7A illustrates an enlarged top view of the light-receiving elements 20*a* and 20*b* in accordance with the first embodiment. As illustrated in FIG. 7A, the lower mesa 21 (the n-type semiconductor layer 25) has a circular cylinder shape, and has a cut-off area in a part of an outer circumference. In the first embodiment, the wirings 40*b* and 40*d* have a large width in the cut-off area of the lower mesa 21 (the n-type semiconductor layer 25). Thus, the lower mesa 21 has a groove. And a region of a narrow width of the wirings 40*b* and 40*d* is located on the side face located in the groove.

In the first embodiment, the capacitance is generated because the insulating layer 60 acts as a dielectric body between the wirings 40*b* and 40*d* and the n-type semiconductor or the i-type semiconductor layer of the light-receiving element. Therefore, the capacitance may be generated when an air acts as a dielectric body between the cut-off area of the lower mesa 21 (the n-type semiconductor layer 25) and the wirings 40*b* and 40*d*. In concrete, the capacitance in the cut-off area of the n-type semiconductor layer 25 is expressed as the following equation (2) when an area where the wirings 40*b* and 40*d* face with the n-type semiconductor layer 25 is expressed as "s", an average distance between the wirings 40*b* and 40*d* and the n-type semiconductor layer 25 is expressed as "d", and the permittivity in vacuum is expressed as "$\epsilon_0$". The capacitance is enlarged according to the distance between the n-type semiconductor layer 25 and the wirings 40*b* and 40*d*.

Figure 7B:
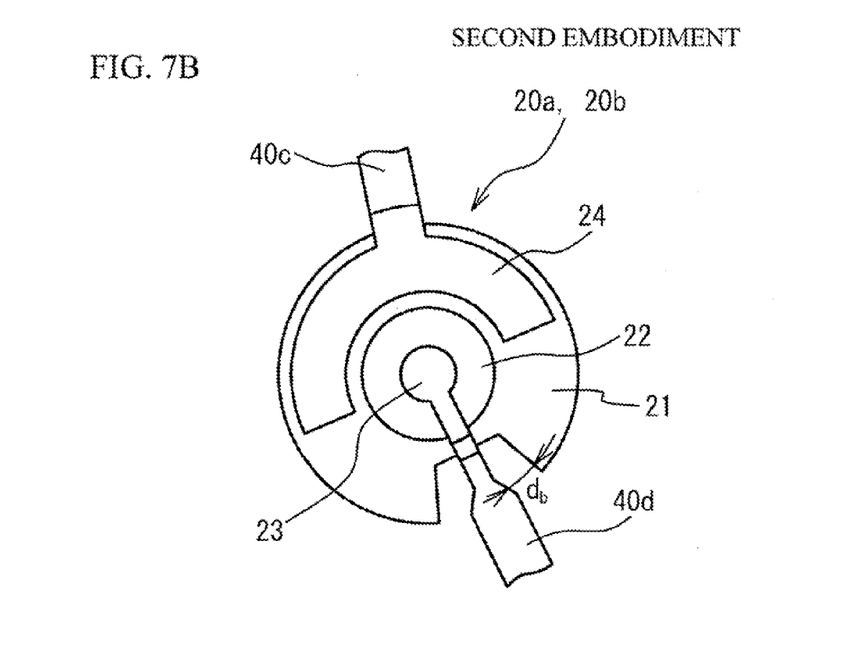
FIG. 7B illustrate an enlarged top view of a light-receiving element in accordance with the second embodiment.
Figure 8:
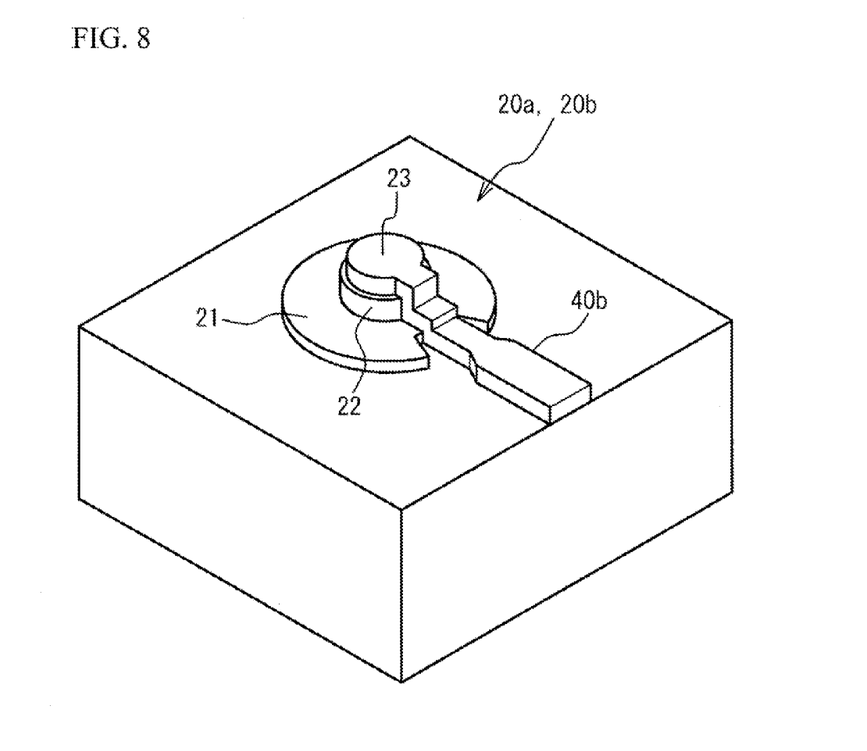
FIG. 8 illustrates a perspective view around a light-receiving element.

And so, in the second embodiment, as illustrated in FIG. 7B and FIG. 8, the wirings 40*b* and 40*d* have a narrow width in the cut-off region of the n-type semiconductor layer 25. Thus, the capacitance generated between the n-type semiconductor layer 25 and the wirings 40*b* and 40*d* is restrained. Therefore, in the second embodiment, both the capacitance and the inductance are restrained, and the capacitance is more restrained. It is preferable that the width of the wiring gets larger gradually in view of signal transmission characteristics. Thus, the wiring 40*d* has a tapered shape.

[Equation 2]

$$C = \epsilon_0 \cdot \frac{S}{d} \quad (2)$$

Figure 9A:
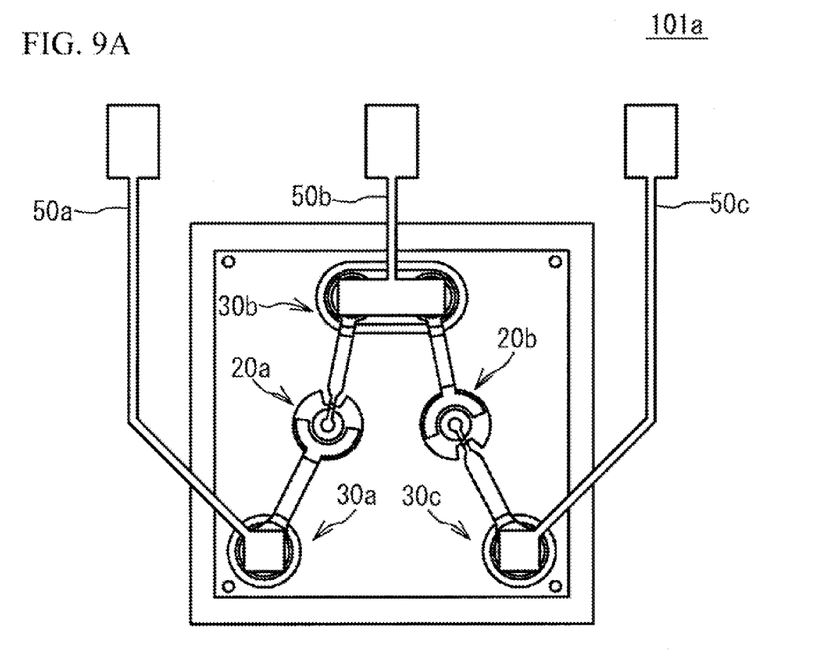
FIG. 9A illustrates a carrier and a semiconductor light-receiving device.
Figure 9B:
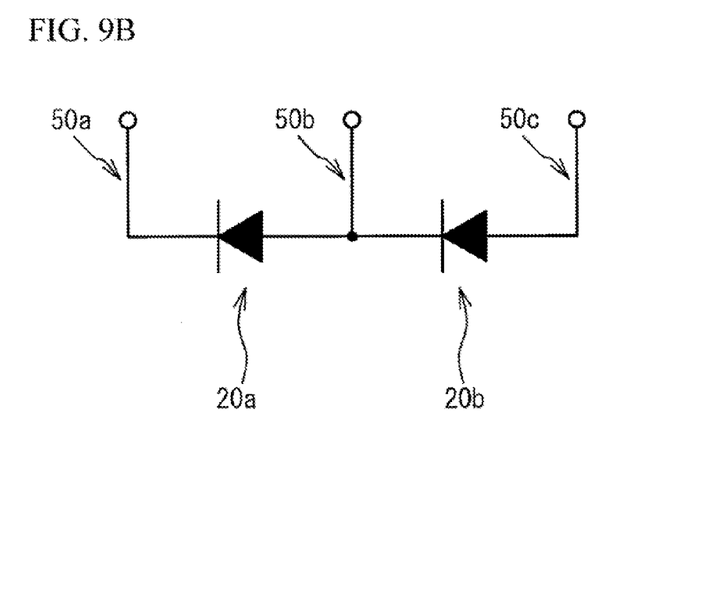
FIG. 9B illustrates a circuit diagram of a semiconductor light-receiving device.

FIG. 9A illustrates a semiconductor light-receiving device 101*a* in which the carrier 50 and the semiconductor light-receiving device 100*a* are coupled to each other. FIG. 9B illustrates a circuit diagram of the semiconductor light-receiving device 101*a*. The semiconductor light-receiving device 101*a* is different from the semiconductor light-receiving device 101 of the first embodiment in a point that the width of the wirings 40*b* and 40*d* is narrow in the cut-off region of the lower mesa 21 (the n-type semiconductor layer 25).

As illustrated in FIG. 9B, the semiconductor light-receiving device 101*a* is a balanced type light-receiving element in which the light-receiving element 20*a* and the light-receiving element 20*b* are coupled in series in an identical direction as well as the semiconductor light-receiving device 101.

Third Embodiment

Figure 10:
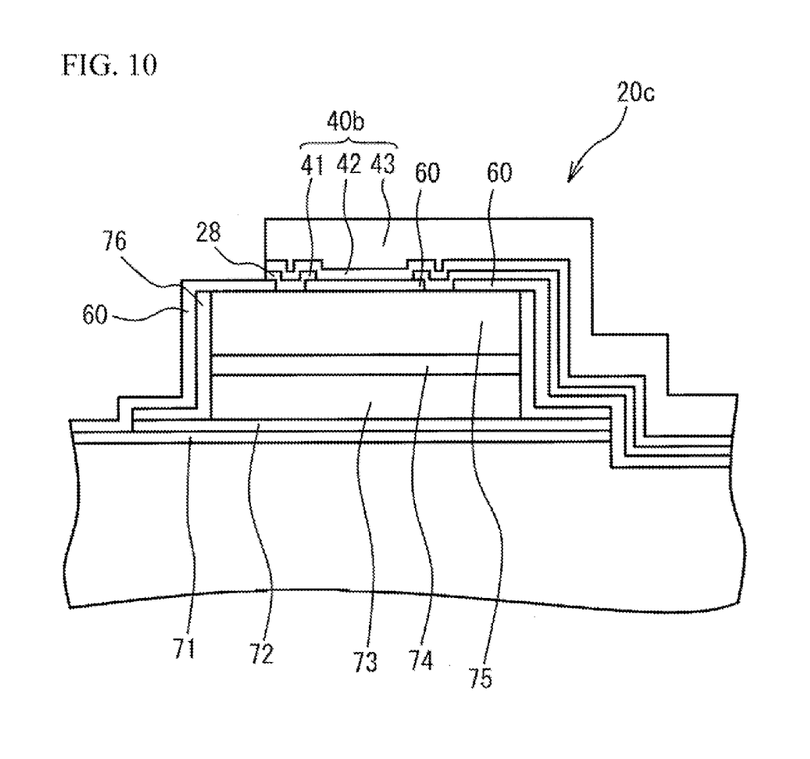
FIG. 10 illustrates a cross sectional view a light-receiving element in accordance with a third embodiment.

FIG. 10 illustrates a light-receiving element 20*c* in accordance with a third embodiment. As illustrated in FIG. 10, the light-receiving element 20*c* has a passivation layer made of n-type InP. The light-receiving element 20*c* has a structure in which an n-type InGaAs layer 71, an n-type InP layer 72, an n-type InGaAs layer 73, an i-type InGaAs layer 74 and a p-type InGaAs layer 75 ate provided on the semiconductor substrate 10 in this order.

A lower mesa includes the n-type InGaAs layer 71, the n-type InP layer 72, and the n-type InGaAs layer 73. An upper mesa includes a part of the n-type InGaAs layer 73, the i-type InGaAs layer 74 and the p-type InGaAs layer 75. A passivation layer 76 is formed on a side face of the upper mesa and an upper face of the lower mesa.

In the example of FIG. 10, a capacitance may be generated in an area where the wiring 40*b* coupled to the p-type semiconductor layer (a first conductivity type region) faces with the n-type semiconductor layer (a second conductivity type region) through the insulating layer 60. In the example of FIG. 10, the area includes an area where the wiring 40*b* faces with the upper face of the passivation layer 76 in the upper mesa, an area where the wiring 40*b* faces with the side face of the passivation layer 76 in the upper mesa, an area where the wiring 40*b* faces with the upper face of the passivation layer 76 in the lower mesa, and an area where the wiring 40*b* faces with the passivatioin layer 76, the n-type InGaAs layer 71 and the n-type InP layer 72 in the lower mesa. Therefore, in the example of FIG. 10, when the wiring 40*b* has a width narrower than on the semiconductor substrate 10 in at least a part of the areas, both the capacitance and the inductance are restrained.

Fourth Embodiment

In the first embodiment through the third embodiment, the light-receiving elements of a back surface incident type are described. In a fourth embodiment, the present invention is applied to a semiconductor light-receiving element of a front surface incident type. In the above-mentioned embodiments, the width of the wiring is narrow in an area where the wiring coupled to the p-type semiconductor layer faces with the n-type semiconductor layer through the insulating layer. However, the structure is not limited. For example, the width of the wiring may be narrow in an area where the wiring coupled to the n-type semiconductor layer (a first conductivity region) faces with the p-type semiconductor layer (a second conductivity region) through the insulating layer. Each semiconductor layer on the semiconductor substrate 10 may be epitaxially grown.

The present invention is not limited to the specifically disclosed embodiments and variations but may include other embodiments and variations without departing from the scope of the present invention.

What is claimed is:

1. A semiconductor light-receiving device comprising:
a semiconductor substrate;
a mesa that has an n-type conductive layer, a light absorption layer and a p-type conductive layer laminated in that order from the semiconductor substrate, on the semiconductor substrate;
a first electrode that is electrically coupled to the p-type conductive layer and is located on the p-type conductive layer; and
an insulating layer made of silicon nitride located on the n-type conductive layer, the light absorption layer, the p-type conductive layer and the semiconductor substrate;
a wiring that is located on the insulating layer and electrically couples the first electrode and an external terminal located on another mesa having a semiconductor region on the semiconductor substrate,
a first region of the wiring being located on the n-type conductive layer,
a second region of the wiring being located between the external terminal and an outside of the mesa on the semiconductor substrate,
a first width of the first region of the wiring being narrower than a second width of the second region of the wiring.

2. The semiconductor light-receiving device as claimed in claim 1, wherein: the mesa has an upper face and a side face; and
the second region of the wiring is located on the upper face and the side face.

3. The semiconductor light-receiving device as claimed in claim 1 wherein:
the mesa has an upper face and a side face;
the side face has a lower region and an upper region having a diameter smaller than that of the lower region;
the lower region has a groove; and
the second region is located on the side face located in the groove.

4. The semiconductor light-receiving device as claimed in claim 1, wherein a passivation layer made of semiconductor is provided between the insulating layer and the side face of the mesa.

5. The semiconductor light-receiving device as claimed in claim 1, wherein the width of the wiring is gradually converted from the first width of the wiring to the second width of the wiring.

6. The semiconductor light-receiving device as claimed in claim 1, wherein the wiring has a tapered shape located between the first region and the second region.

7. The semiconductor light-receiving device as claimed in claim 1, wherein: the mesa has an upper region and a lower region;
the upper region has the p-type conductive layer and the p-type conductive layer;
and
the p-type conductive layer of the upper region is located inside of the n-type conductive layer of the upper region.

* * * * *